(12) United States Patent
Chu et al.

(10) Patent No.: US 7,235,812 B2
(45) Date of Patent: Jun. 26, 2007

(54) METHOD OF CREATING DEFECT FREE HIGH GE CONTENT (>25%) SIGE-ON-INSULATOR (SGOI) SUBSTRATES USING WAFER BONDING TECHNIQUES

(75) Inventors: Jack O. Chu, Manhasset Hills, NY (US); Michael A. Cobb, Croton on Hudson, NY (US); Philip A. Saunders, Millwood, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 10/939,736

(22) Filed: Sep. 13, 2004

(65) Prior Publication Data

US 2006/0054891 A1    Mar. 16, 2006

(51) Int. Cl.
*H01L 29/00* (2006.01)
(52) U.S. Cl. .................. 257/65; 257/347; 257/616; 438/311; 438/479
(58) Field of Classification Search ............... 257/65
See application file for complete search history.

(56) References Cited

U.S. PATENT DOCUMENTS

| 6,100,166 | A | 8/2000 | Sakaguchi et al. |
| 6,524,935 | B1 | 2/2003 | Canaperi et al. |
| 6,593,641 | B1 * | 7/2003 | Fitzergald .................. 257/616 |
| 2004/0195656 | A1 * | 10/2004 | Ghyselen et al. .......... 257/616 |
| 2005/0054175 | A1 * | 3/2005 | Bauer ........................ 438/404 |
| 2006/0003555 | A1 * | 1/2006 | Adam et al. ................ 438/479 |

OTHER PUBLICATIONS

Chu et al.—Search Report for PCT/US05/08493, dated Aug. 16, 2006.

* cited by examiner

*Primary Examiner*—Carl Whitehead, Jr.
*Assistant Examiner*—Colleen E. Rodgers
(74) *Attorney, Agent, or Firm*—Scully, Scott, Murphy & Presser, P.C.; Robert M. Trepp, Esq.

(57) ABSTRACT

A method for achieving a substantially defect free SGOI substrate which includes a SiGe layer that has a high Ge content of greater than about 25 atomic % using a low temperature wafer bonding technique is described. The wafer bonding process described in the present application includes an initial prebonding annealing step that is capable of forming a bonding interface comprising elements of Si, Ge and O, i.e., interfacial SiGeO layer, between a SiGe layer and a low temperature oxide layer. The present invention also provides the SGOI substrate and structure that contains the same.

12 Claims, 4 Drawing Sheets

METHOD OF CREATING DEFECT FREE HIGH GE CONTENT (>25%) SIGE-ON-INSULATOR (SGOI) SUBSTRATES USING WAFER BONDING TECHNIQUES

The present invention described herein was made with U.S. Government support under Contract No. N66001-00-C-8086 awarded by The Department of the Navy. The U.S. Government thus has certain rights in this invention.

FIELD OF THE INVENTION

The present invention relates to the fabrication of a SiGe-on-insulator (SGOI) substrate, and more particularly, to a substantially defect free, high Ge content (>25 atomic %) SGOI substrate as well as method of fabricating the same. The method of the present invention includes a wafer bonding technique that is capable of forming an interfacial bonding layer that includes elements of Si, Ge and O. The interfacial bonding layer is referred to herein as an interfacial SiGeO layer.

BACKGROUND OF THE INVENTION

It is well known to those skilled in the art that strained silicon can enhance carrier mobility for both electrons and holes in comparison with bulk silicon. In addition, the degree of mobility enhancement strongly depends on the strain level in the strained silicon layer. Namely, the higher the imposed "tensile" strain, the higher the enhancement on mobility. The most common practice for applying or inducing tensile strain to a silicon layer is through the use of an underlying silicon germanium (SiGe) buffer layer, which is typically a relaxed SiGe layer having a larger lattice constant as compared to bulk silicon. Hence, by increasing the Ge content of the underlying SiGe buffer layer, which in turn increases the lattice constant of the SiGe buffer layer, a higher "tensile" strain can then be imposed to the silicon layer due to a larger lattice mismatch between the two layers.

It is also well known that metal oxide semiconductor field effect transistor (MOSFET) devices fabricated on silicon-on-insulator (SOI) substrates can have up to 25–35% better performance than those built on bulk Si wafers due to lower parasitic capacitance of the source/drain junction, reduced short channel effects and better device isolation. This is reported, for example, in G. G. Shahidi, "SOI Technology for GHz Era", IBM J. Res. & Dev., Vol. 46, pp. 121–131 (2002). Thus, it is desirable to combine these two effects to generate a strained silicon layer having enhanced carrier mobility on a SiGe-on-insulator (SGOI) substrate to achieve an even higher device performance gain.

However, this prior scheme is faced with two major problems or issues in its attempt to obtain the best device performance from this synergistic combination of strained silicon on SGOI. One issue is the ability to generate a fully relaxed SiGe buffer layer with a high Ge content such that its lattice constant is strictly determined by the value of the Ge content and is independent of its degree of relaxation. Otherwise, the imposed "tensile" strain to the silicon layer would not be as high as desired. Moreover, in the case for a partially relaxed SiGe buffer, the imposed strain could easily fluctuate or change due to subsequent thermal processing or integration steps which is undesirable.

The second issue is the ability to create a near defect-free SGOI substrate with a high Ge content, which is the more difficult problem to address. Although thermally-mixed (TM) SGOI has provided an alternative approach to creating a SGOI substrate, the SiGe layers typically formed on the TM-SGOI wafers are partially relaxed, i.e., about 50 to 65% at best, and have yet to achieve a fully relaxed SiGe layer with greater than 90% relaxation.

In a similar way, the same difficulty has been encountered in preparation of SGOI substrates generated by the alternate SIMOX approach. See, for example, T. Mizuno, et al., "High Performance Strained-Si p-MOSFETs on SiGe-on-Insulator Substrates Fabricated by SIMOX Technology", IEDM Tech. Dig., pp. 934–936 (1999).

Recently, it has been demonstrated that a fully relaxed SiGe buffer layer can be transferred to a handle wafer through a wafer bonding technique. See U.S. Pat. No. 6,524,935 to D. F. Canaperi, et al. However, the bonded SGOI wafers prepared from this prior art process still suffer from various bond-induced defects, such as blisters, bubbles, voids, etc., especially for the high Ge content SGOI wafers where the Ge content is larger than 25 atomic (at.) %.

SUMMARY OF THE INVENTION

The present invention describes a method for achieving a substantially defect free SGOI substrate which includes a SiGe layer that has a high Ge content of greater than about 25 atomic % using a low temperature wafer bonding technique. The term "substantially defect free" is used in the present application to denote a SiGe layer that has a defect density, including misfits, threading defects, microtwins, stacking faults and other defects, that is about $10^4$ to about $10^5$ defects/cm$^2$ or less, and is dictated by the initial SiGe buffer. Currently, high temperature RT-CVD growth techniques are being developed to grow high content SiGe buffers with low defect densities in the range of $10^3$–$10^4$ defects/cm$^2$. The wafer bonding process described in the present application includes an initial prebonding annealing step that is capable of forming a bonding interface comprising elements of Si, Ge and O, i.e., an interfacial SiGeO layer, between the SiGe layer and an oxide, which substantially eliminates or reduces any bonding induced defects and increases the bonding yield of the SGOI substrates.

Specifically, by subjecting an initial high Ge content SiGe wafer covered with a layer of deposited low temperature oxide (later serving as the buried oxide, BOX) to an appropriate thermal annealing step, a bonding interface comprising a thin layer of SiGeO or a mixture of Si/Ge oxide is formed in the present invention between the SiGe layer and the low temperature oxide. This interdiffused or oxygen-enriched SiGeO layer, i.e., the bonding interface or interfacial SiGeO layer, is believed to act as a gettering layer to either trap defects or prevent volatile gases or residuals (such as hydroxyl group, hydrogen, oxygen, and the like) from penetrating into the SiGe film from either the BOX layer or the bonded BOX/SiGe interface during a densificaton step and can thereby reduce or eliminate any undesirable blistering due to entrapped, residual volatile species.

In addition, the bonding interface layer, i.e., the interfacial SiGeO layer, can further serve to suppress hydrogen from diffusing or migrating from the high concentration region (of the smart cut region) to the SiGe/BOX interface during the subsequent post-bonding anneal and wafer splitting anneal steps. If no such anneal step is implemented and no such interfacial layer exists, the bonded SGOI with its high Ge content layer will suffer from severe blistering, bubbling, and void generation problems typically associated with a low yield in wafer bonding process. Nevertheless, the thickness of the interfacial SiGeO layer can be tailored by adjusting the anneal temperature and time.

In broad terms, the method of the present invention comprises the steps of:

forming a low temperature oxide atop a structure that comprises a fully relaxed SiGe layer located on a sacrificial substrate;

first annealing said structure including said low temperature oxide at a first temperature to form an interfacial layer comprising elements of Si, Ge and O between the low temperature oxide and said SiGe layer;

providing an implant region within said fully relaxed SiGe layer;

bonding said low temperature oxide to a surface of a semiconductor substrate, wherein said bonding comprises contact bonding to form a bond between said exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed; and re-annealing the structure at a fourth temperature that is greater than the third temperature to form a SiGe-on-insulator (SGOI) substrate that comprises the semiconductor substrate, said low temperature oxide located on said semiconductor substrate, and said fully relaxed SiGe layer having a defect density of about $10^4$ to about $10^5$ defects/cm$^2$ or less and a Ge content that is greater than 25 atomic % located atop said low temperature oxide, wherein said low temperature oxide and said fully relaxed SiGe layer are separated by said interfacial layer.

In some embodiments, the fully relaxed SiGe layer can be smoothed and thinned after the re-annealing step. In yet another embodiment of the present invention, a thin SiGe buffer layer can be grown atop the fully relaxed SiGe layer after the re-annealing step and a strained semiconductor layer can be formed thereon. Alternatively, a strained Si or SiGe semiconductor layer can be formed directly on the fully relaxed SiGe layer after the re-annealing step. At least one complementary metal oxide semiconductor (CMOS) device such as a nFET or a pFET can be formed atop the strained semiconductor layer utilizing conventional CMOS processing steps that are well known in the art.

In another embodiment, a high temperature oxide is formed on the fully relaxed SiGe layer prior to formation of the low temperature oxide.

In addition to the processing steps mentioned above, the present invention also provides a SiGe-on-insulator (SGOI) substrate that comprises a semiconductor substrate;

a buried oxide layer located on said semiconductor substrate; and a fully relaxed SiGe layer having a defect density of about $10^4$ to about $10^5$ defects/cm$^2$ or less and a Ge content that is greater than 25 atomic % located atop said buried oxide layer, wherein said buried oxide layer and said SiGe layer are separated by an interfacial layer comprising elements of Si, Ge and O.

The present invention also provides a semiconductor structure that includes:

a strained semiconductor layer located atop a SiGe-on-insulator (SGOI) substrate, said SGOI substrate comprising a semiconductor substrate, a buried oxide layer located on said semiconductor substrate, and a fully relaxed SiGe layer having a defect density of about $10^4$ to about $10^5$ defects/cm$^2$ or less and a Ge content that is greater than 25 atomic % located atop said buried oxide layer, wherein said buried oxide layer and said fully relaxed SiGe layer are separated by an interfacial layer comprising elements of Si, Ge and O.

It is noted that the term "fully relaxed" when used in conjunction with the SiGe layer denotes a layer of silicon germanium that has a measured relaxation value of greater than 90%. More preferably, the fully relaxed SiGe layer of the present invention has a measured relaxation value of greater than 95%.

DETAILED DESCRIPTION OF THE INVENTION

The present invention, which provides a substantially defect free, high Ge content SGOI substrate and a method of fabricating the same, will now be described in greater detail by referring to the following description and drawings that accompany the present application. It is noted that the drawings depicted in FIGS. 1A–1E and FIG. 2 are provided for illustrative purposes and thus those drawings are not drawn to scale.

Figure 1A:
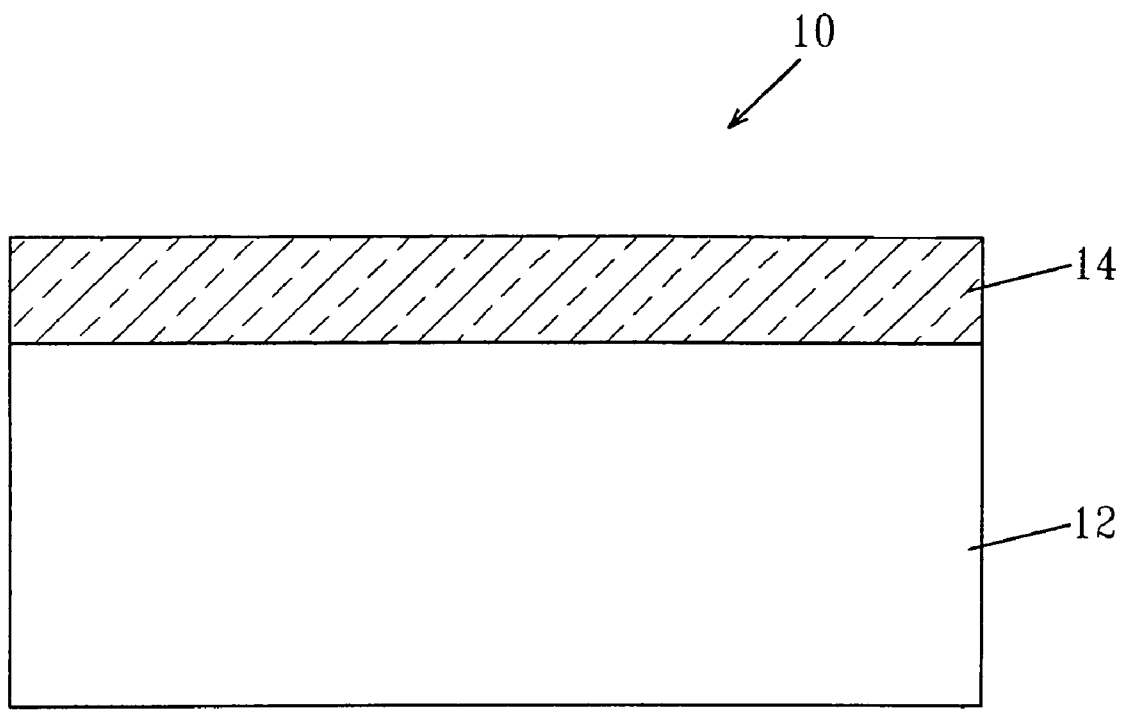
FIGS. 1A–1E are pictorial representations (through a cross sectional views) illustrating the processing steps that are employed in the present invention for fabricating a substantially defect free, high Ge content SGOI substrate.
Figure 1B:
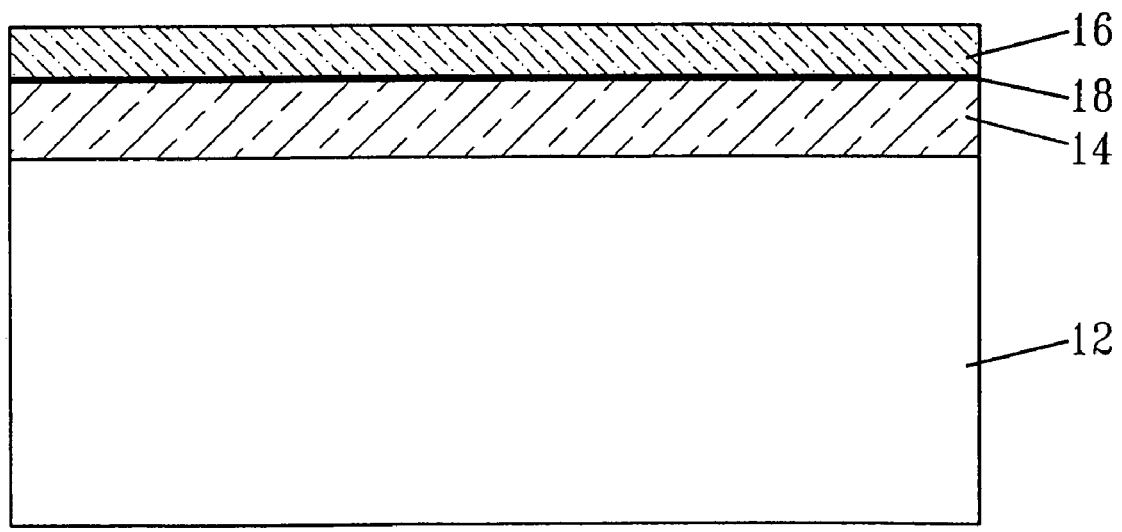

Reference is first made to FIG. 1A which shows an initial structure 10 that is employed in the present invention. The initial structure 10 includes a SiGe layer 14 that is crystalline and fully relaxed located on a surface of a sacrificial substrate 12. The sacrificial substrate 12 can include any type of material including semiconducting, insulating or conducting, preferably semiconducting or insulating, and even more preferably semiconducting. Illustrative examples of semiconducting materials that can be used as the sacrificial substrate 12 include, but are not limited to: Si, SiGe, SiC, SiGeC, GaAs, InP, InAs and layered semiconductors including, for example, Si/SiGe, SOIs and SGOIs. Examples of insulating materials that can be employed as the sacrificial substrate 12 include various glasses or polymers, and examples of conducting materials that can be employed as the sacrificial substrate 12 include metals.

In accordance with the present invention, the SiGe layer 14 is a graded layer that includes a varying content of Ge in which the initial content of Ge that is in proximity to the sacrificial substrate 12 is low (10 atomic % or less, preferably 5 atomic % or less). The Ge content is then increased within the SiGe layer 14 in a stepwise manner, gradually reaching the intended high Ge content. By "high Ge content" it is meant a SiGe layer having a Ge content that is greater than 25 atomic %, preferably greater than 30 atomic %, more preferably greater than 35 atomic %, and even more preferably greater than 45 atomic %. The graded portion of the SiGe layer 14 is formed utilizing a conventional deposition process such as, for example, ultra-high vacuum chemical vapor deposition (UHVCVD) or rapid thermal chemical vapor deposition (RTCVD), that is well known to those skilled in the art. The graded portion of the SiGe layer 14 has a thickness that is typically from about 100 to about 1500 nm.

After the target Ge content is reached, a thick upper relaxed SiGe buffer portion is formed over the graded portion providing the SiGe layer 14 shown in FIG. 1A. The relaxed buffer portion of the SiGe layer 14 is formed utilizing a deposition process such as, for example an UHVCVD or a RTCVD, that is well known to those skilled in the art. The upper relaxed SiGe buffer portion of the SiGe layer 14 has a thickness that is typically from about 500 to about 3000 nm.

The SiGe layer 14 formed as described above is a highly relaxed (greater than 90%) layer that has a high content (greater than 25 atomic %) of Ge. The thickness of the SiGe layer 14 is the total thickness of the graded portion and the upper relaxed SiGe buffer portion. Typically, and using the numbers provided above, the SiGe layer 14 has a thickness from about 1 to about 5 μm. It is noted that in FIG. 1A the different portions (i.e., lower graded portion and upper relaxed SiGe buffer portion) are not specifically shown. If shown, the lower portion of the SiGe layer 14 that is in close proximity to the surface of sacrificial substrate 12 would be comprised of a low Ge content region, the area above the low Ge content area would comprise a region in which the Ge content was increased in a stepwise fashion and the upper portion atop the increased Ge content step portion would comprise the relaxed SiGe buffer region.

Since the surface of the SiGe layer 14 is typically rough, having a peak-to-peak roughness $R_{max}$ in the range from 40 to 100 nm, a planarization process such as chemical mechanical polishing (CMP) is typically required to smooth and thin the SiGe layer 14 at this point of the present invention. Thus, the structure shown in FIG. 1A can now be subjected to a CMP process that is capable of smoothing and thinning the SiGe layer 14. In order to alleviate or eliminate the embedded particle problem during the planarization process, which results in difficulty in removing particles generated by a conventional CMP process in the subsequent cleaning steps, a non-conventional low-down force of about 1 to 2 psi is employed in the present invention. As stated above, the planarization step, provides a structure in which the SiGe layer 14 is smooth, i.e., having a $R_{max}$ of less than 10 nm, and thin, having a thickness from about 500 to about 1000 nm.

After the planarization process, the structure 10, particularly layer 14, is typically subjected to a cleaning step that is capable of removing unwanted particles from the surface of the SiGe layer 14. The unwanted particles are generated from the CMP process mentioned above. Although any cleaning process can be employed, a modified RCA wet cleaning process is employed in the present invention. The modified RCA process employs a combination of $NH_4OH$ (ammonia hydroxide), $H_2O_2$ (hydrogen peroxide) and deionized water (DI) in which the ratio of the components is 1:1:5. This combination, which is heated at 50° C.–60° C., can thoroughly clean residue (including particles) left from CMP on SiGe buffer wafers. The modified RCA clean process is preferred in the present invention since it is capable of forming a hydrophilic surface that is terminated with hydroxyl groups. The cleaning process may include a single cleaning step, but multiple cleaning steps are preferred.

After providing a sufficiently clean and particle free SiGe surface, a low temperature oxide 16 is formed atop the SiGe layer 14. In the present invention, the low temperature oxide 16 can be formed directly on the SiGe layer 14 or a high temperature oxide can first be formed and then the low temperature oxide 16 is formed on the high temperature oxide. The low temperature oxide 16 is formed by either a plasma enhanced chemical vapor deposition (PECVD) process or a low pressure chemical vapor deposition (LPCVD) process, both of which are well known to those skilled in the art. The low temperature oxide is formed at a deposition temperature of about 450° C. or less. The low temperature oxide (hereinafter LTO) 16 formed at this point of the present invention has a thickness that typically ranges from about 200 to about 400 nm. More preferably, the LTO 16 has a thickness from about 280 to about 320 nm. As known to those skilled in the art, a LTO is characterized as having an amorphous crystal structure.

When a high temperature oxide (HTO) is employed, the HTO is first formed, followed by the formation of the LTO 16. In those embodiments in which a HTO is formed, the HTO is formed by a rapid thermal chemical vapor deposition process or any other deposition process in which the deposition temperature is greater than 500° C. If present, the HTO has a thickness that typically ranges from about 5 to about 30 nm. More preferably, the HTO would have a thickness from about 10 to about 20 nm. As known to those skilled in the art, HTO may be a crystalline oxide at certain critical thickness, of less than about 5 nm.

It should be noted that in the drawings of the present invention, the HTO layer is not shown. In the embodiments in which it is present, the HTO would be located between the SiGe layer 14 and the overlying LTO 16. The presence of the HTO helps in tailoring the thickness of the interfacial bonding layer that will be subsequently formed.

Next, a first annealing step is performed at a first annealing temperature T1 which is capable of forming an interfacial bonding layer 18 between the LTO 16 and the SiGe layer 14. In embodiments in which the HTO is present, the interfacial bonding layer 18 is located between the HTO/LTO stack and the SiGe layer 14. In accordance with the present invention, the interfacial bonding layer 18 comprises elements of Si, Ge and O. Thus, the interfacial layer 18 is referred to herein as a SiGeO layer.

The first annealing step employed in the present invention is performed at a temperature T1 from about 600° to about 700° C. for a period of time from about 300 to about 1000 minutes. More preferably, the first annealing step which forms the interfacial layer 18 is performed at a temperature T1 from about 620° to about 630° C. for a period of time from about 450 to about 800 minutes. The first annealing step is typically performed in an inert ambient including He, $N_2$, Ar, Kr, Ne, Xe or mixtures thereof. Alternatively, a forming gas which includes a mixture of $N_2$ and $H_2$ can be employed. The first anneal may be performed at a single targeted temperature utilizing a single ramp up rate, or various ramp and soak cycles using various ramp rates and soak times can be employed.

The first anneal also serves the purpose of driving out excessive hydroxyl groups and volatile gases inside the LTO 16, as well as densifying the LTO 16. Adjusting the annealing temperature and/or varying the annealing time can tailor the thickness of the interfacial layer 18. Typically, the interfacial layer 18 formed by the first annealing step of the present invention has a thickness from about 10 to about 50 nm, with a thickness from about 25 to about 35 nm being more typical.

In addition to the above features, the interfacial layer 18 is crucial for stopping any outgas from the SiGe layer 14 during the post-bonding and the splitting anneals mentioned herein below so as to guarantee the formation of a substantially low defect and high quality SGOI substrate. In essence, the interfacial layer 18 helps to "getter" structural defects and any residual gases promoting a stronger and more stable interface between the SiGe layer 14 and the LTO 16. The resultant structure that is formed after the first annealing step has been performed is shown, for example, in FIG. 1B.

Figure 1C:
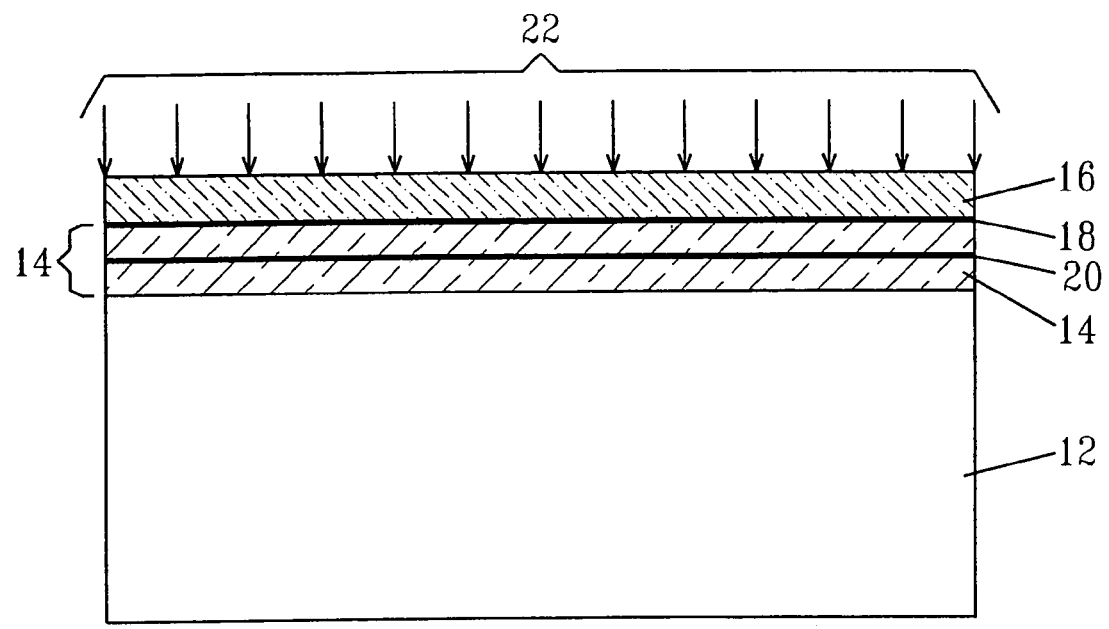

Next, an implant region 20 is formed within a region of the SiGe layer 14 as is shown in FIG. 1C. The implant region 20 is formed by implanting H ions 22 such as $H_2^+$ through the LTO 16, the interfacial layer 18 into the SiGe layer 14. The implant region 20 has a peak ion concentration that is located at a depth from about 200 to about 500 nm below the upper surface of the SiGe layer 14. The implant region 20 is formed by implantation of hydrogen ions. The implant conditions can vary depending upon the thickness of the SiGe layer 14. Typical implantation conditions used in forming the implant region 20 are as follows: ion energy from about 60 to about 150 KeV and a hydrogen ion dose from about 3E16 to about 5E16 atoms/cm². More typically, the implant region 20 is formed utilizing an ion implantation process that is performed at an energy from about 120 to about 125 KeV and a hydrogen ion dose from about 3.5E16 to about 4.5E16 atoms/cm².

Next, another CMP step can be used to trim down the LTO 16 thickness to a desired thickness value that can be chosen by those skilled in the art. Typically, and for most types of devices, the LTO 16 is trimmed down at this point of the present invention to a thickness from about 100 to about 200 nm, with a thickness from about 140 to about 160 nm being more typical. The CMP process performed at this point of the inventive method also serves to achieve a smooth LTO surface which meets the typical surface requirements for wafer bonding, i.e., the root mean square roughness $R_{rms}$ is less than 0.5 nm. After the CMP process, further cleaning steps as described above can be employed to clean the smoothed surface of the LTO 16.

Figure 1D:
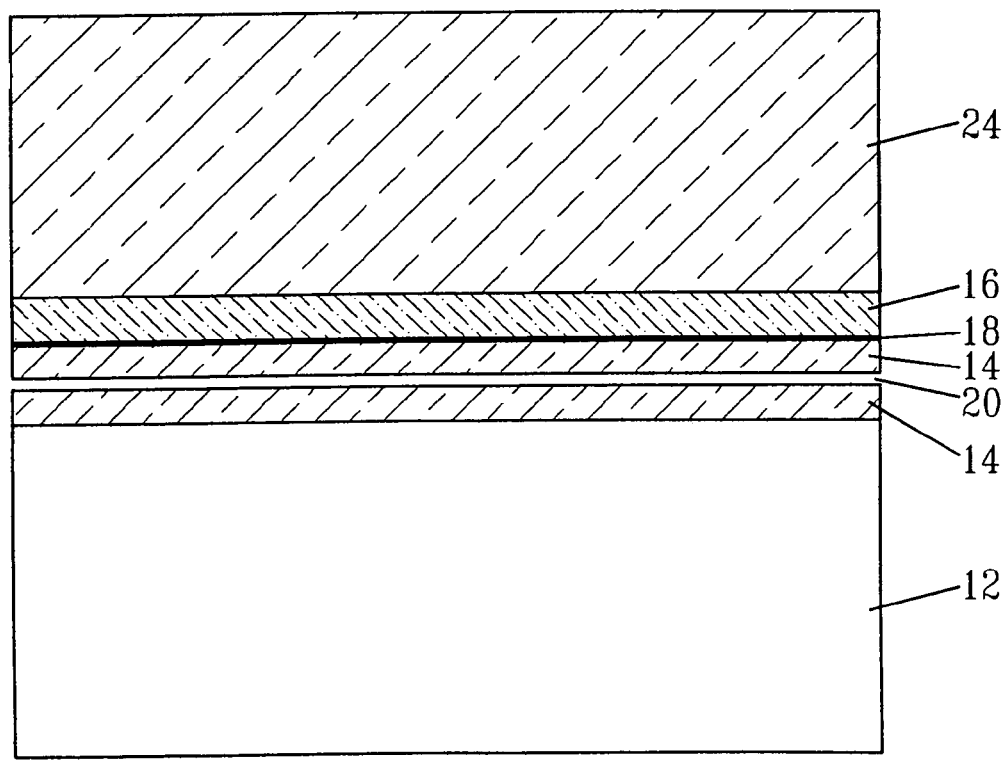
Figure 1E:
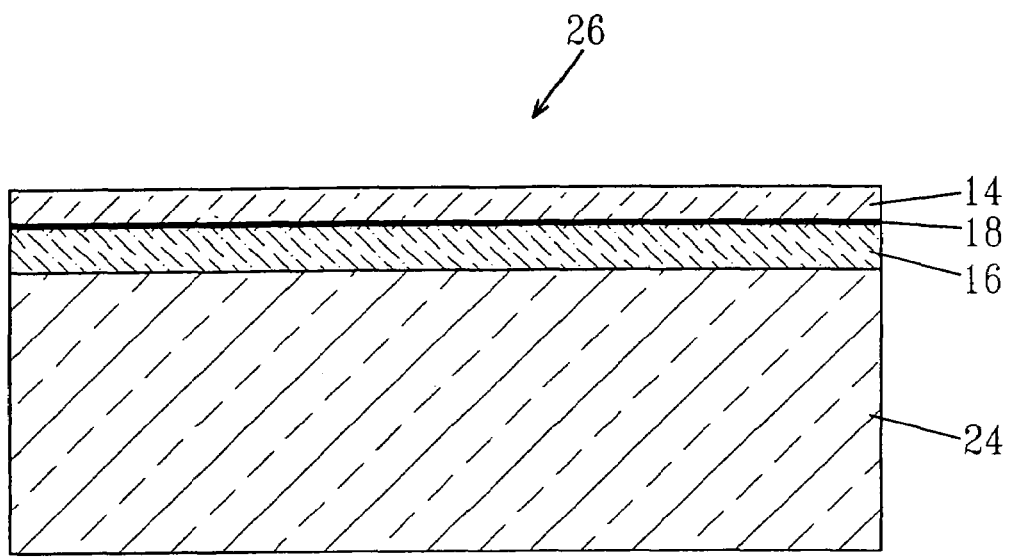

Next, the structure shown in FIG. 1C is bonded to a semiconductor substrate 24 providing the structure shown for example, in FIG. 1D. As shown, the exposed LTO surface shown in FIG. 1C is bonded to a surface of the semiconductor substrate 24. The semiconductor substrate 24 includes one of the above mentioned semiconducting materials that can be used as the sacrificial substrate 12. The bonding step includes first bringing a surface of semiconductor substrate 24 into intimate contact with a surface of the LTO 16. An external pressure can be applied during and/or after the contact step.

The contact and thus the initial bonding are performed at nominal room temperature. By "nominal room temperature" it is meant a temperature from about 18° to about 40° C. Prior to the bonding process, the surface of semiconductor substrate 24 which will be bonded to the LTO 16 is subjected to a cleaning process such as the modified RCA cleaning process mentioned above. It is noted that the modified RCA clean process forms a hydrophilic surface that is terminated by hydroxyl groups. The formation of hydrophilic surfaces on both the LTO 16 and the semiconductor substrate 24 helps to facilitate the bonding between the two layers. Specifically, the bonding is facilitated at these mating surfaces (the LTO 16 and the semiconductor substrate 24) by the formation of hydrogen bonds and the subsequent formation of stronger siloxane bonds.

After the initial bonding process which includes contact bonding, the bonding process further includes a post-bonding anneal (i.e., a second annealing step) that is performed at a temperature T2 that is relatively low so as to prevent hydrogen induced crack propagation in the implant region 20 from occurring prior to bond strengthen which is achieved during this post-annealing (i.e., second annealing).

Typically, the second annealing step is performed at a temperature T2 from about 225° to about 350° C. for a time period from about 5 to about 30 hours. More typically, the second annealing step is performed at a temperature T2 from about 250° to about 300° C. for a time period from about 16 to about 24 hours. This annealing step is performed in one of the above mentioned ambients and various heating regimes including different ramp up rates, soak cycles and cool down rates can be employed.

Following the bonding strengthen second annealing step, a third annealing step is performed at a temperature T3 which is greater than T2 so as to allow a hydrogen induced Oswald ripen effect to occur, i.e., to form a crack in the SiGe layer 14 at the plane of the implant region 20. That is, T3 is performed at a temperature that forms a crack at the implant region 20 which is capable of separating, i.e., splitting, a portion of the SiGe layer 14 and the underlying sacrificial substrate 12 from the structure. A razor blade or other like means can be used to aid in the separation process. The resultant structure is shown, for example in FIG. 1E.

Typically, the third annealing step (which can be referred to as a splitting anneal) is performed at a temperature T3 from about 485° to about 550° C. for a time period from about 4 to about 6 hours. More typically, the third annealing step is performed at a temperature T3 from about 495° to about 505° C. for a time period from about 4.5 to about 5.5 hours. This third annealing step is performed in one of the above mentioned ambients and various heating regimes including different ramp up rates, soak cycles and cool down rates can be employed.

In accordance with the present invention, the temperature T2 to strengthen the bonded pair is less than the temperature T3 to cause splitting of the structure. Moreover, temperature T1 used in forming the bonding interface between the LTO 16 and the fully relaxed SiGe layer 14 is greater than the splitting temperature T3. Also, temperature T1 is equal to or greater than T4 (which is discussed below).

A re-annealing step that is performed at a fourth temperature T4 that is greater than T3 can be performed to further strengthen the bonding between the layers. The re-annealing step, i.e., fourth anneal performed in the present invention, is typically conducted at a temperature T4 from about 600° to about 700° C. for a time period from about 1 to about 10 hours. More typically, the fourth annealing step is performed at a temperature T4 from about 620° to about 630° C. for a time period from about 7.5 to about 8.5 hours. This fourth annealing step is performed in one of the above mentioned ambients and various heating regimes including different ramp up rates, soak cycles and cool down rates can be employed.

Note that the second and third annealing steps may be performed without breaking vacuum within a same annealing chamber. Alternatively, the second, third and fourth anneals may be performed in different annealing chambers, if desired.

At this point of the present invention, the SiGe layer 14 that remains after the splitting process can be subjected to a thinning step wherein CMP, ion beam etching, or a high pressure oxidation and a wet etch process can be used to thin the SiGe layer 14 to a desired final thickness. Typically, the desired final thickness for the SiGe layer 14 is from about 5 to about 50 nm, with a final desired thickness of from about 10 to about 25 nm being more typical. Prior to thinning, the surface of the remaining SiGe layer 14 can be smoothed utilizing the low down force CMP process mentioned above.

The above processing steps provide a SiGe-on-insulator (SGOI) substrate 26 (see FIG. 1E) that comprises the semiconductor substrate 24, the low temperature oxide 16 located on the semiconductor substrate 24, and the fully relaxed SiGe layer 14 having a defect density of about $10^4$ to about $10^5$ defects/cm$^2$ or less and a Ge content that is greater than 25 atomic % located atop the low temperature oxide 16. As shown, the interfacial layer 18 is still present between the low temperature oxide 16 and the fully relaxed SiGe layer 14. Note that the LTO 16 is the buried insulating layer of the final SGOI substrate 26.

Figure 2:
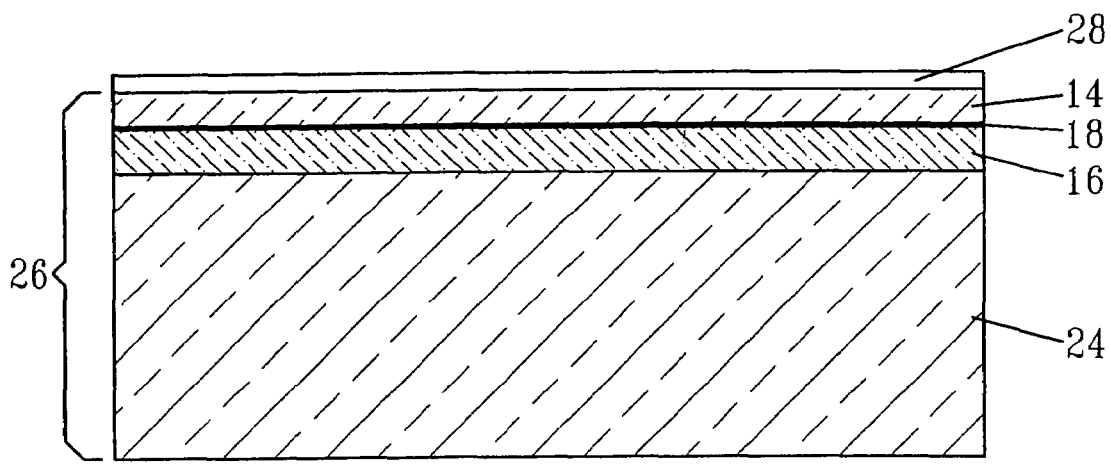
FIG. 2 is a cross-sectional view of the SGOI substrate shown in FIG. 1E after forming a strained semiconductor layer on the fully relaxed SiGe layer.

FIG. 2 shows a further processing step in which a strained semiconductor layer 28 is formed on the SiGe layer 14 or alternatively a thin (on the order of about 10 nm or less) regrown SiGe layer with either the same Ge content as layer 14 or a different Ge content can be formed prior to formation of the strained semiconductor layer 28. The regrown SiGe layer is formed as described above. The strained semiconductor layer 28 which can be comprised of Si, SiGe, SiC, SiGeC and the like is formed by an epitaxial growth process. The strained semiconductor layer 28 formed at this point of the present invention typically has a thickness from about 2 to about 20 nm, with a thickness from about 3 to about 10 nm being more typical.

It should be noted that the surface crystal orientation of layer 14 and thus the strained semiconductor layer 28 can be (100), (110), (111) or any other like crystallographic orientation.

Conventional CMOS processing steps can then be performed to provide at least one CMOS device such as a FET on the surface of the structure shown in FIG. 2.

The following example is provided to illustrate the method of the present invention which is used in forming a substantially defect free, high Ge content SGOI substrate.

EXAMPLE

Figure 3:
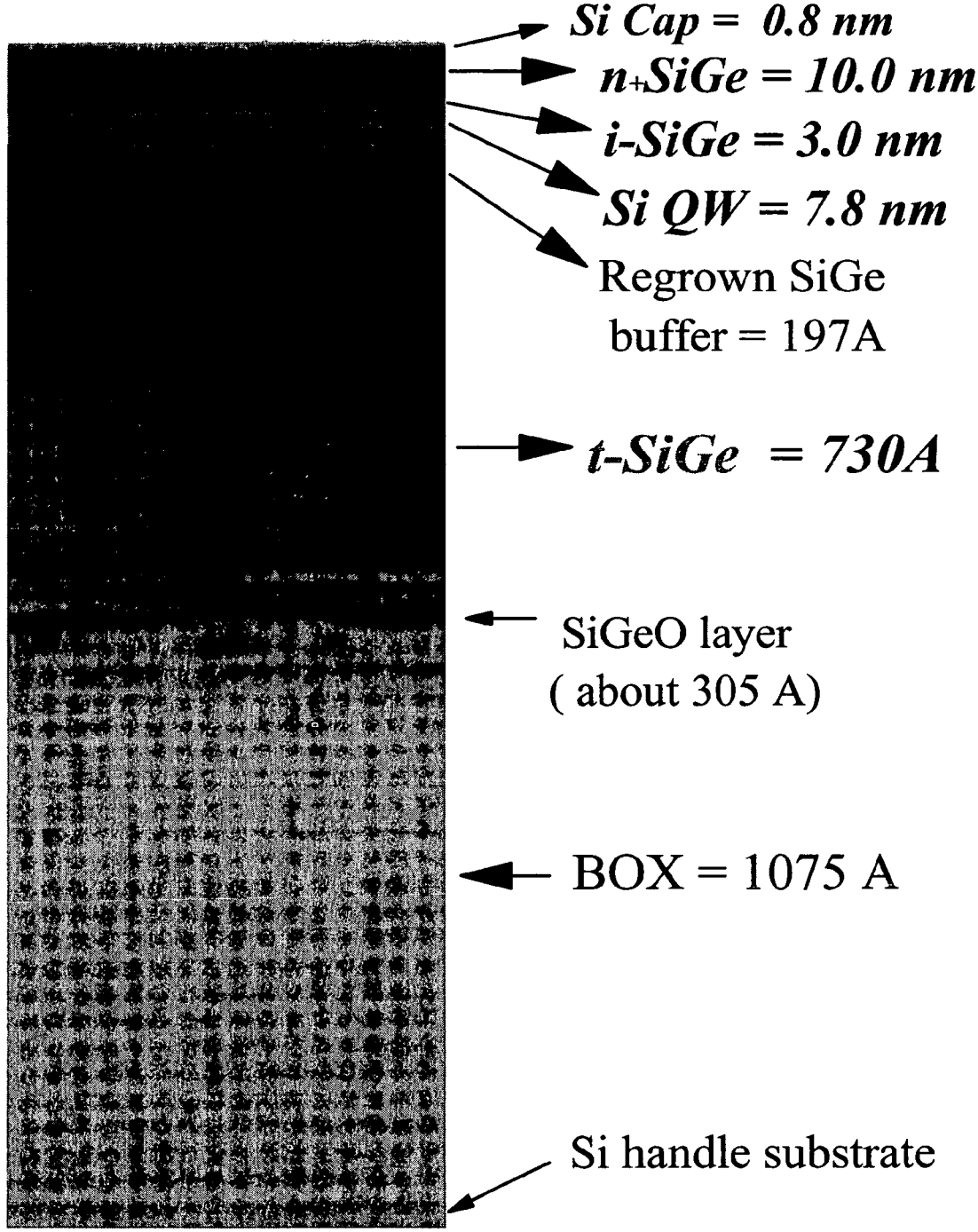
FIG. 3 is an actual TEM cross sectional micrograph showing an SGOI substrate created using the method of the present invention.

In this example, a substantially low defect, high Ge content SGOI wafer is provided utilizing the processing steps of the present invention. This process follows the general procedure outlined above, but provides a more detailed and specific implementation of the inventive method. The process starts with a bulk Si wafer that was cleaned by conventional RCA wet cleans. A graded SiGe buffer layer was then deposited on the bulk Si wafer utilizing a conventional deposition process. The total thickness of the SiGe buffer layer was about 1.5 to 2.0 μm. Chemical mechanical polishing (CMP) with a down-force of about 1.5 psi was used to smooth the surface of the SiGe buffer layer and simultaneously to reduce the thickness of the buffer layer by an amount of a couple of hundred nanometers. Afterwards, and in addition to the conventional brush cleaning normally associated with CMP, the wafer was further cleaned in a modified RCA solution several times to remove the particles and the residuals left from CMP. Once the wafer reached the required cleanness (usually several tens to a couple of hundreds particles counted by a particle scanner on the wafer are acceptable), a LTO having a thickness of about 300 nm was deposited on top of the smoothed and cleaned SiGe layer. In order to eliminate defects induced by outgassing in the subsequent process steps involving elevated temperatures, the wafer with the deposited LTO was annealed at 625° C. for about 800 minutes. The TEM cross section shown in FIG. 3 indicated that a SiGeO interfacial oxide layer with a thickness of about 30 to 40 nm was formed between the LTO and the SiGe buffer layer. In FIG. 3, the Si handle substrate=semiconductor substrate 24, BOX=LTO 16, SiGeO=interface 18, t-SiGe=SiGe layer 14, and the remaining layers are additional layers, as indicated, that can be formed atop the SGOI substrate of the present application.

The wafer was then ion-implanted with ionized hydrogen $H_2^+$ at an energy of about 130 KeV and up to a dose of about 3.6E16 atoms/cm$^2$. Based on SIMS data (not shown), the ionized hydrogen at this energy penetrated through the LTO layer and peaked at a depth of about 300 nm into the SiGe buffer layer. After hydrogen implantation, the LTO layer was polished to reduce its thickness down to a designated thickness of about 150 nm as well as to smooth its surface so as to satisfy the surface condition for bonding, i.e., $R_{rms}$<0.5 nm. The particulate residue from the CMP was cleaned using a brush clean followed by a modified RCA clean. The surface of the LTO and a Si handle substrate were recleaned in a fresh modified RCA clean solution, and the two bonding surfaces were dried in a $N_2$ ambient prior to bringing the two surfaces in contact.

Post-bonding annealing was conducted at 300° C. for 20 hours to strengthen the bond between the LTO and Si wafer by converting the hydrogen bond to a covalent one. The bonded pair was split by annealing at 500° C. for 5 hours. The handle wafer with the transferred layer was then annealed at 625° C. for 8 hours to further strengthen the integrity of SGOI structure. CMP touch polish was used to smooth the transferred SGOI layer. The final SGOI thickness can be further reduced by either CMP or ion-beam etching.

Mobility experiments were performed for strained Si-MODFET devices that were built on such a SGOI substrate and the results of these experiments are summarized as follows:

at 295 $K$: 1741 cm$^2$/Vs, 1.46×10$^{12}$ cm$^{-2}$;

at 25 $K$: 16,062 cm$^2$/Vs, 1.26×10$^{12}$ cm$^{-2}$.

The results from the mobility experiments demonstrated that high mobility can be achieved using the inventive SGOI substrate material. Similarly, for current strained Si MOSFET devices electron mobility in the range of 500–1000 cm$^2$/Vs has been demonstrated on SGOI substrates with Ge contents from 20–50 atomic %.

For n-MOSFET or n-MODFET device applications, epitaxial silicon can be deposited on top of the final SGOI structure to form a tensilely strained silicon layer for enhanced electron mobility. Similarly, a high Ge content SiGe layer (i.e., greater than 50%) may be deposited on top of the final SGOI structure to form a compressively strained SiGe channel for enhanced hole mobility suitable for p-MOSFET or p-MODFET device applications.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

The invention claim is:

1. A SiGe-on-insulator (SGOI) substrate comprising:
a semiconductor substrate;
a buried oxide layer comprising a stack of a low temperature oxide and a high temperature oxide located on said semiconductor substrate; and
a fully relaxed SiGe layer having a defect density of about $10^4$ to about $10^5$ defects/cm$^2$ or less and a Ge content that is greater than 25 atomic % located atop said buried oxide layer, wherein said buried oxide layer and said SiGe layer are separated by an interfacial layer comprising elements of Si, Ge and O.

2. The SGOI substrate of claim 1 wherein said fully relaxed SiGe layer has a measured relaxation value of greater than 90%.

3. The SGOI substrate of claim 1 wherein said interfacial layer has a thickness from about 10 to about 50 nm.

4. The SGOI substrate of claim 1 wherein said fully relaxed SiGe layer has a thickness from about 5 to about 50 nm.

5. A semiconductor structure comprising:
a strained semiconductor layer located atop a SiGe-on-insulator (SGOI) substrate, said SGOI substrate comprising a semiconductor substrate, a buried oxide layer comprising a stack of a low temperature oxide and a high temperature oxide located on said semiconductor substrate, and a fully relaxed SiGe layer having a defect density of about $10^4$ to about $10^5$ defects/cm$^2$ or less and a Ge content that is greater than 25 atomic % located atop said buried oxide layer, wherein said buried oxide layer and said fully relaxed SiGe layer are separated by an interfacial layer comprising elements of Si, Ge and O.

6. The semiconductor structure of claim 5 wherein said fully relaxed SiGe layer has a measured relaxation value of greater than 90%.

7. The semiconductor structure of claim 5 wherein said interfacial layer has a thickness from about 10 to about 50 nm.

8. The semiconductor structure of claim 5 wherein said fully relaxed SiGe layer has a thickness from about 5 to about 50 nm.

9. The semiconductor structure of claim 5 further comprising at least one CMOS device located on said strained semiconductor.

10. The semiconductor structure of claim 9 wherein said at least one CMOS device is a FET.

11. The semiconductor structure of claim 5 wherein said strained semiconductor layer and said fully relaxed SiGe layer have identical surface crystallographic orientations.

12. The semiconductor structure of claim 11 wherein said surface crystallographic orientation comprises (100), (111) or (110).

* * * * *